United States Patent [19]

Lavergnat et al.

[11] Patent Number: 4,580,227
[45] Date of Patent: Apr. 1, 1986

[54] DEVICE FOR DETERMINING AND FOLLOWING THE INSTANTANEOUS COORDINATES OF THE EXTREME VALUE OF A CURVE

[76] Inventors: Jacques Lavergnat, 10 rue Barrault, 75013 Paris; Jean-Yves Delahaye, 55 rue Jean Jaurès, 92170 Vanves, both of France

[21] Appl. No.: 440,617

[22] Filed: Nov. 10, 1982

[30] Foreign Application Priority Data

Nov. 20, 1981 [FR] France .................. 81 21786

[51] Int. Cl.⁴ .............. G06G 7/36; G06G 7/00; G06G 7/18; G06F 15/31
[52] U.S. Cl. .................. 364/487; 364/605; 364/807; 364/828; 364/829
[58] Field of Search .......... 364/605, 607, 815, 817, 364/816, 807, 828, 829, 487; 376/143; 328/150, 155, 160, 127

[56] References Cited

U.S. PATENT DOCUMENTS

| | | | |
|---|---|---|---|
| 3,003,080 | 10/1961 | Post | 376/143 |
| 3,080,754 | 7/1961 | Johnson | 376/143 |
| 3,300,640 | 1/1967 | Eubank | 376/143 |
| 3,404,262 | 10/1968 | Udall | 364/828 |
| 3,733,248 | 5/1973 | Hendel et al. | 376/143 |
| 4,017,721 | 4/1977 | Michaud | 364/513 |
| 4,107,689 | 8/1978 | Jellinek | 364/450 |
| 4,124,838 | 11/1978 | Kiss | 364/561 |
| 4,143,314 | 3/1979 | Grubor . | |
| 4,183,671 | 1/1980 | Jacobson | 376/143 |
| 4,298,948 | 11/1981 | Davis | 364/508 |

FOREIGN PATENT DOCUMENTS 0027405 4/1981 European Pat. Off. .
2386854 11/1978 France .

OTHER PUBLICATIONS

Automatisme, vol. 13, No. 3, Mar. 1968, Paris J. L. Abatut et al., "Classification des systemes de regulation extremale", pp. 123-126.
Electronic Engineering, vol. 37, No. 445, Mar. 1965, London, P. Zorkoczy: "A Simple Automatic Extremum Seeker", pp. 178-179.

*Primary Examiner*—John W. Caldwell, Sr.
*Assistant Examiner*—Donna Angotti
*Attorney, Agent, or Firm*—Oblon, Fisher, Spivak, McClelland & Maier

[57] ABSTRACT

The invention relates to a device for determining and following the instantaneous coordinates of the extreme value of a curve $y=f(x)$, characteristic of a system having an input x and an output y.

The device comprises a multiplier having two inputs and one output, a first differentiator, whose input is connected to the input x of the system and whose output is connected to one of the inputs of the multiplier, a second differentiator, whose input is connected to the output y of the system and whose output is connected to the other input of the multiplier, and an integrator, whose input is connected to the output of the multiplier and whose output is connected to the input x of the system.

6 Claims, 8 Drawing Figures

DEVICE FOR DETERMINING AND FOLLOWING THE INSTANTANEOUS COORDINATES OF THE EXTREME VALUE OF A CURVE

BACKGROUND OF THE INVENTION

The present invention relates to a device for determining and following the instantaneous coordinates of the extreme value of a curve $y=f(x)$, characteristic of a system having an input x and an output y.

This device can in particular be used for obtaining information on the electron temperature and electron density of the ionospheric plasma or the magnetospheric plasma.

Within the scope of this application, the system having an input x and an output y is constituted by a high frequency sensor supplying an electrical signal. The electrical signal, in the case of a sensor suitable for measuring the electron density of the ionospheric plasma can, for example, be illustrated in the manner shown in FIG. 1 by a curve giving the variations of the impedance $z/z_0$ of the sensor as a function of the frequency f, expressed in megahertz. As can be seen, this curve has a main maximum M. Through knowing the coordinates $x_M$, $y_M$ of this maximum and in particular the abscissa $x_M$ (frequency), information can directly be obtained on the electron density, N, of the ionospheric plasma. Since the plasma frequency, $\Omega = Ne^2/m\epsilon_u$, the electron density is easily calculated once the plasma frequency is known. Depending on the type of sensor used, the plasma frequency is equal to the maximum value from the sensor either directly or by way of a simple calculation. This determination of the coordinates of the maximum takes place by means of an electronic circuit directly connected to the input x and the output y of the sensor and which processes the signal supplied by the latter.

In general, the determination of coordinates of the extreme value, i.e. the maximum or minimum of a curve $y=f(x)$ takes place with the aid of a device, which scans the x's. Unfortunately this type of determination leads to the scanning of zones which are without interest for obtaining information on the coordinates of the extreme value and this leads to a considerable time loss. This can be a nuisance in the case where the extreme value of the curve $y=f(x)$ moves over a period of time. This is almost always the case, when this curve represents physical quantities such as, for example, the electrical signal supplied by a sensor used for determining the electron temperature or density of the ionosphere.

In the case of an evolution over a period of time of the extreme value of curve $y=f(x)$, the devices using a scan of the x's, in view of their response time, do not make it possible in many cases to determine the coordinates of the extreme value with a good level of accuracy and do not make it possible to follow the evolution of the latter over a period of time.

In order to obviate these disadvantages, the use has been envisaged of devices limiting the scan of the x's to the values close to those of the abscissa $x_M$ of the extreme value. These devices are generally called extremely servocontrol devices. The description and operation of these devices appear in a book published by DUNOD in 1976 and entitled "Introduction aux systemes asservis extremaux et adaptatifs" and whose authors are P. DECAULNE, J. CH. GILLE and M. PELEGRIN.

In this type of device, the determination of the coordinates $x_M$, $y_M$ of the extreme value of a curve $y=f(x)$ takes place by choosing a point on the coordinates $x_0$, $y_0$ close to the extreme value and by modifying the control value x and consequently y up to the time when $x-x_M=0$ is obtained. This is in fact a servocontrol process.

FIG. 2 shows a gradient-type extreme servocontrol device operating on the basis of this principle. This device comprises a divider 2 having two inputs and an output, a first differentiator 4, whose input is connected to the input x of a system 6 (sensor) and whose output is connected to one of the inputs of the divider 2. There is also a second differentiator 8, whose input is connected to the output y of system 6 and whose output is connected to the other input of divider 2. There is also an integrator 10, whose input is connected to the output of divider 2 and whose output is connected to the input x of system 6.

Although they provide the extreme value coordinates more rapidly than the previously described devices and although they make it possible to follow the evolution of the extreme value over a period of time, the response time of such a device is much too long, when the extreme value of the curve moves at a high speed.

In addition, the response of this device, i.e. the variations of x as a function of time, starting from a value $x_0$, it only makes it possible to reach the value $x_M$ in an asymptotic manner, which is illustrated by the curve of FIG. 3a.

In view of the fact that $x_M$ is reached asymptotically, this device only makes it possible to obtain the value of abscissa $x_M$ of the extreme with a very good precision at the end of an infinite time. Conversely, the value of the abscissa $x_M$ of the extremum can be obtained at the end of a very short time, but with a poor precision.

BRIEF SUMMARY OF THE INVENTION

The object of the present invention is to provide a device for determining and following the instantaneous coordinates of the extreme value of a curve $y=f(x)$, characteristic of a system having an input x and an output y. This device makes it possible to obviate the disadvantages referred to hereinbefore and makes it possible to determine and follow the coordinates of the extreme value in an accurate manner and in a short time, i.e. approximately 1 millisecond. It is in fact an extreme servocontrol device.

More specifically the present invention relates to a device having in per se known manner:

a first differentiator able to produce a first voltage and whose input is connected to the input x of the system, a second differentiator able to produce a second voltage and whose input is connected to the output y of the system, means receiving the voltages produced by the two differentiators for supplying a voltage which is a function of the voltages produced by said differentiators, and an integrator, whose input is connected to the output of said means and whose output is connected to the input x of the system, wherein the said means are constituted by a multiplier.

This device makes it possible to rapidly and accurately determine the coordinates of the extreme value of a curve $y=f(x)$, because the value of $x_M$, unlike in the prior art device, is obtained at the end of a finite time $t_A$ with a very good precision. This is illustrated by the curve of FIG. 3b giving variations of x as a function of time and starting with a value $x_0$. From the mathematical standpoint and bearing in mind that the value of $x_M$ is reached with an infinite speed (vertical tangent at $x_M$), this point is called the attractor point.

According to a preferred embodiment of the invention, the device comprises a discontinuous gain amplifier, whose input is connected to the output of the second differentiator and whose output is connected to the input of the multiplier, said amplifier being able to produce a voltage $V_s$ which, when the voltage $V_e$ produced by the second differentiator is negative, is equal to $V_e$ and which, when voltage $V_e$ is positive is equal to $-V_e+C$, C being a constant which is a function of the characteristic parameters of the first differentiator, the integrator and the multiplier.

According to a preferred embodiment of the invention, the device also comprises means for modifying the displacement voltage of the integrator and whose input is connected to the output of the second differentiator, said modification consisting of periodically applying to the input of the integrator a voltage $+\Delta W$ and a voltage $-\Delta W$.

According to a variant of this embodiment, the means for modifying the displacement voltage comprise means for comparing the voltage $V_e$, produced by the second differentiator, with a voltage $V_c$, which is a function of the characteristic parameters of the first differentiator, the integrator and the multiplier and means for periodically applying, after a time $T_r$, the voltage $+\Delta W$ and the voltage $-\Delta W$, when $V_e$ is at the most equal to $V_c$.

According to another preferred embodiment of the invention, the device also comprises means for initializing the voltage applied to the input x of the system. These initialization means comprise, for example, means making it possible to regulate the initial voltage and means for restoring the voltage applied to the input x of the system to said initial voltage. This can in particular be used when the curve $y=f(x)$ temporarily has no extreme value.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

The device according to the invention making it possible to determine and follow the coordinates $x_M$, $y_M$ of the extreme value of a curve $y=f(x)$, characteristic of a system having an input x and an output y, such as for example a sensor making it possible to determine the electron temperature or density of the ionospheric plasma is an extreme servocontrol device. In the following description, the different values of x or the control voltage x about the extreme value are chosen in a range between $-10$ V and $+10$ V, but this is clearly only an example of the range for x.

Figure 4:
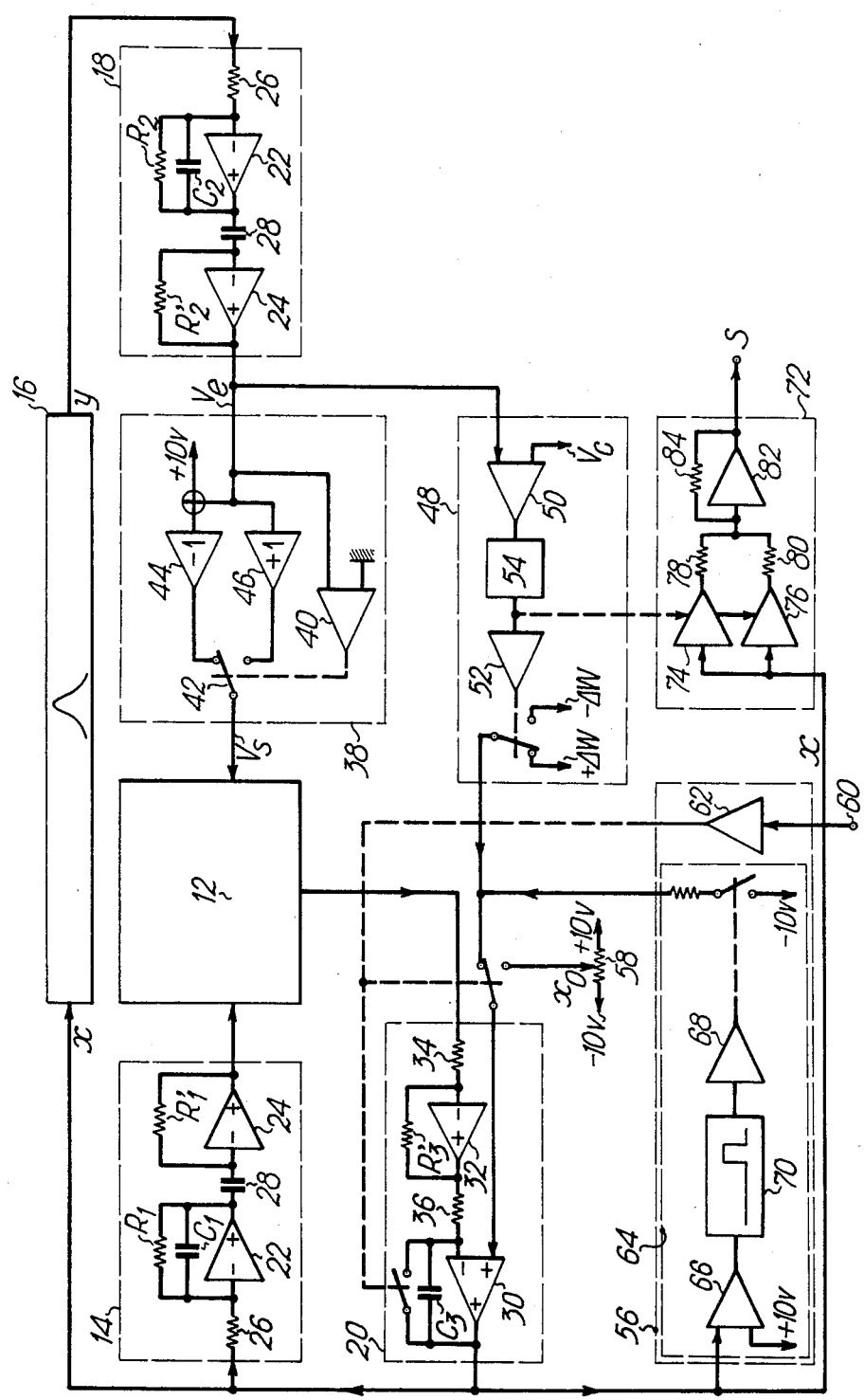
FIG. 4 a block diagram of the device according to the invention.

With reference to FIG. 4, the device according to the invention essentially comprises a multiplier 12 having two inputs and an output, a first differentiator 14, whose input is connected to the input x of a system 16, the output of said differentiator 14 being connected to one of the inputs of the multiplier 12, a second differentiator 18, whose input is connected to the output y of system 16 and whose output is connected to the other input of multiplier 12 and an integrator 20, whose input is connected to the output of multiplier 12 and whose output is connected to an input x of system 16.

Figure 1:
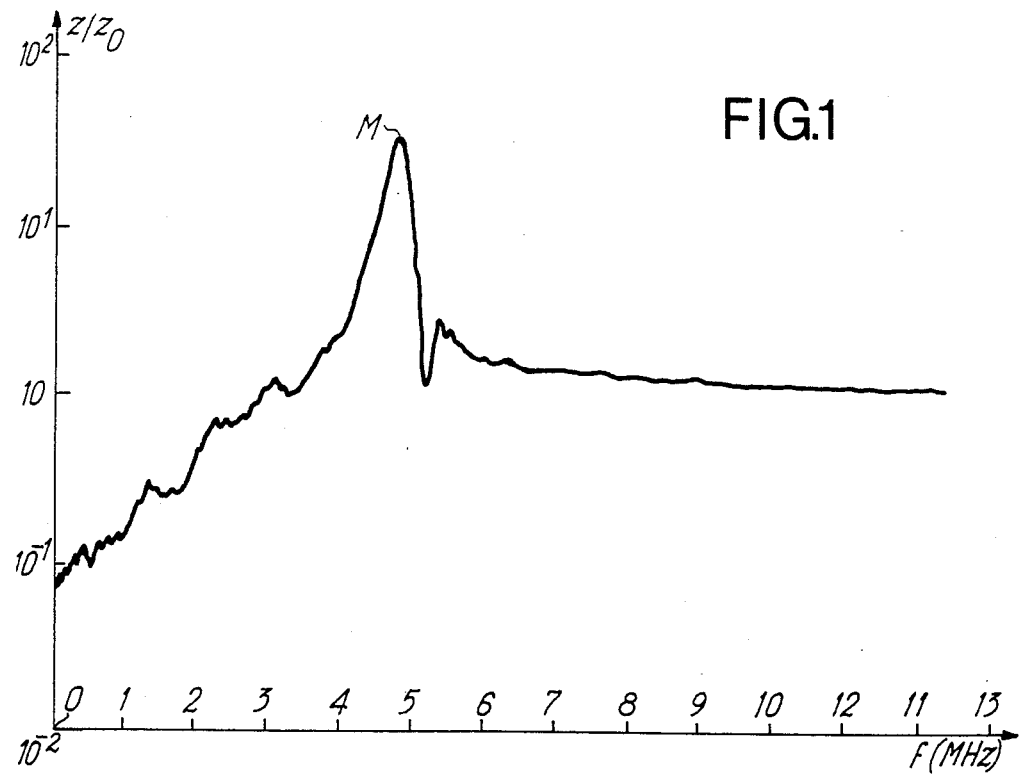
FIG. 1 already described, a curve giving the variations of the impedance $z/z_0$ of a sensor for the density of the ionospheric plasma as a function of the frequency f, expressed in megahertz.
Figure 2:
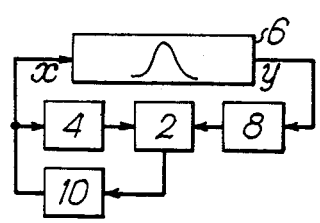
FIG. 2 already described, a block diagram of a prior art device.
Figure 3A:
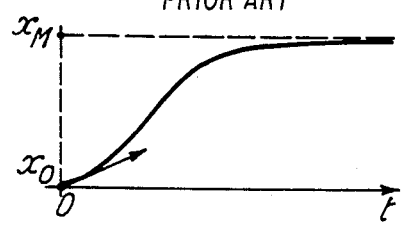
FIG. 3 already described, curves giving the variations of x as a function of time, FIG. 3a corresponding to the response of the signal of a prior art device and FIG. 3b to that of the device according to the invention.
Figure 3B:
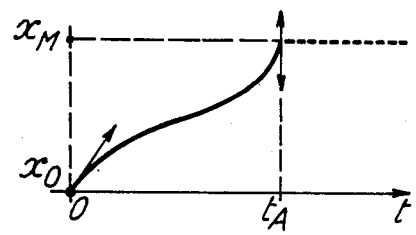

As has been stated hereinbefore, the fact that the divider 2 of the prior art device (cf. FIG. 2) is replaced by a multiplier 12 according to the invention, makes it possible to obtain at the end of a finite time $t_A$ (FIG. 3b) and with a good precision, the instantaneous coordinates $x_M$ and $y_M$ of the extreme value of a curve $y=f(x)$, corresponding in the case of a sensor to the electrical signal supplied by the latter (FIG. 1). Moreover, the fact that the derivative of x with respect to the time (dx/dt) tends towards infinity for x equal to $x_M$ makes it possible to obtain a good performance following the extreme value when the latter varies in time.

As is diagrammatically shown in FIG. 4, the first and second differentiators 14 and 18 more particularly comprise phase shifting networks having resistors 26 and 26' and operational amplifiers 22 and 22' formed by amplifiers and by RC circuits, $R_1C_1$ for the first differentiator and $R_2C_2$ for the second differentiator, connected between the inputs and outputs of the amplifiers 22 and 22', and actual differentiating circuits having capacitors 28 and 28' and operational amplifiers formed by amplifiers 24 and 24', and by a resistor, $R'_1$ for the first differentiator and $R'_2$ for the second differentiator, connected between the inputs and outputs of the amplifiers 24 and 24'. The input of the phase shifting network is connected to the input x of the system, via resistor 26, and the output of the phase shifting network is connected to the input of the differentiating circuit, via capacitor 28.

It should be noted that the time constant ($R_2C_2$) introduced by the phase shifting network of the second differentiator 18 corresponds to that introduced by a low-pass filter located at the output of system 16, when the latter corresponds to a sensor making it possible to determine the electron density or temperature of the ionospheric plasma. This filter is necessary to reduce the noise intercepted by the sensor. In order to give an order of magnitude, the time constant is taken as equal to 1 ms.

With regards to the time constant ($R_1C_1$) introduced by the phase shifting network of the first differentiator 14, the latter is taken as equal to $2.10^{-4}$s.

Moreover, the products $R'_1C_{28}$ and $R'_2C_{28}$, characteristic of the actual differentiators, are taken as equal to 10 ms, $C_{28}$ representing the capacitance value of capacitors 28.

In the same way, integrator 20 comprises an integrating circuit having a resistor 36 and an operational amplifier formed by an amplifier 30 and by a capacitor $C_3$ connected between the negative input and the output of the amplifier 30, and a phase shifting network having a resistor 34 and an operational amplifier 32 formed by an amplifier and a resistor $R'_3$ connected between the output and by the input of the amplifier 32. The input of the phase shifting network is connected to the output of multiplier 12, via resistor 34, and the output of the phase shifting network is connected to the negative input of the amplifier 30 of the integrating circuit via resistor 36. The product $R_{36}C_3$, characteristic of the integrator, is taken e.g. as equal to 5 ms, $R_{36}$ representing the value of resistor 36.

In order to take account of variations in the different operational amplifiers more particularly constituting differentiators 14 and 18, as well as their time constants, introduced more particularly by the phase shifting networks, the device according to the invention must be equipped with a discontinuous gain amplifier 38, whose input is connected to the output of the second differentiator 18 and whose output is connected to the input of multiplier 12.

This discontinuous gain amplifier 38 makes it possible to produce an output voltage $V_s$ such that when the input voltage $V_e$ of this amplifier supplied by the second differentiator 18 is negative, we obtain $V_s = V_e$ and when the voltage $V_e$ is positive we obtain $V_s = -V_e + C$, C being a constant which is a function of the characteristic parameters of the first differentiator 14, the integrator 20 and the multiplier 12. These parameters mainly represent the amplification factors of the various circuits forming differentiators 14 and 18 and the multiplier 12. For example, constant C is taken as equal to 10 V for values of x varying between $-10$ V and $+10$ V.

Figure 5:
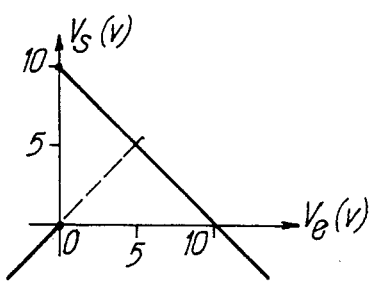
FIG. 5 a curve giving the variations of the output voltage $V_s$ of the discontinuous gain amplifier, expressed in volts, as a function of the input voltage $V_e$ of the amplifier, expressed in volts.

FIG. 5 shows the curve giving the output voltage $V_s$ of the discontinuous gain amplifier, expressed in volts, as a function of the input voltage $V_e$ of said amplifier, expressed in volts, the variations of $V_s$ as a function of $V_e$ being given in a voltage range varying between $-10$ V and $+10$ V.

This discontinuous gain amplifier 38 makes it possible to rapidly obtain the extreme value of curve $y=f(x)$ and to reduce this speed when the latter is exceeded. Amplifier 38 comprises, for example, a comparator 40 making it possible to compare the input voltage $V_e$ of the amplifier with a zero voltage or earth. This comparator 40 controls a switch 42, which can for example be an analog gate and which makes it possible to connect the input of multiplier 12 either to the output of an inverting operational amplifier 44, or to the output of a noninverting operational amplifier 46.

The device according to the invention described hitherto, essentially makes it possible to reach and determine the coordinates of the extreme value of curve $y=f(x)$.

Thus, the device can be used for accurately and rapidly determining the coordinates of the extreme value of a curve $y=f(x)$ in the case where the extreme value does not vary over a period of time.

In order to follow the evolution of the extreme value over a period of time, when it varies, the device according to the invention must be provided with a system 48 for modifying the shift or displacement voltage of integrator 20. The input of system 48 is connected to the output of the second differentiator 18 and the output of system 48 is connected to the input of the actual integrating circuit forming integrator 20. Preferably, the output of system 48 is connected to the positive input of the amplifier 30 constituting the actual integrating circuit. System 48 for modifying the shift or displacement voltage of integrator 20 by applying a voltage $\Delta W$, periodically passing from $+\Delta W$ to $-\Delta W$ to the positive input of amplifier 30.

System 48 is mainly constituted by a comparator 50 making it possible to compare the voltage $V_e$ supplied by the second differentiator 18 with a voltage $V_c$, which is a function of the characteristic parameters of the first differentiator 14, the integrator 20 and the multiplier 12. When the voltage $V_e$ is at the most equal to voltage $V_c$, comparator 50 gives the order to apply a voltage equal to either $+\Delta W$ or $-\Delta W$ to the positive input of amplifier 30, the applying of $\Delta W$ or $-\Delta W$ being controlled by a switch formed by an operational amplifier 52. This voltage is applied after a time $T_r$ produced by a delay cell 54, which can for example be a hysteresis gate associated with a RC circuit, connected between the output of comparator 50 and the input of operational amplifier 52.

Figure 6A:
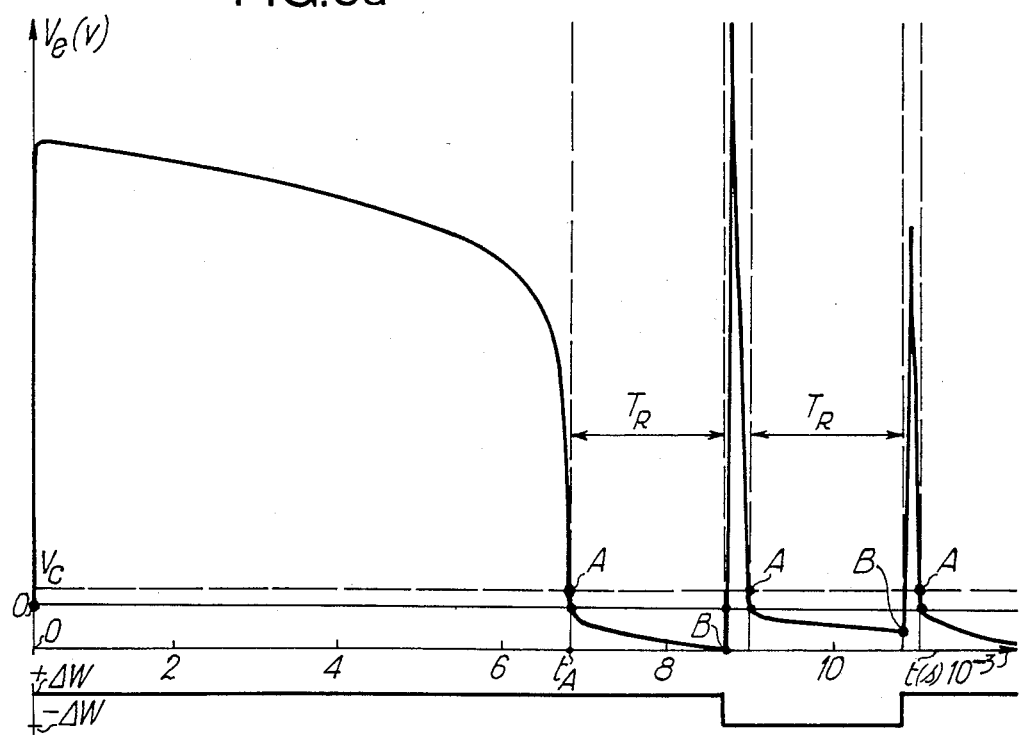
FIG. 6a and FIG. 6b respectively the variations of the input voltage $V_e$ of the discontinuous gain amplifier and of x, expressed in volts, as a function of the time, expressed in seconds.

FIG. 6a shows the variations of the voltage $V_e$ produced by the second differentiator 18, expressed in volts, as a function of the time t, expressed in seconds. The variations of the voltage $V_e$ over a period of time are a function of the displacement voltage $\Delta W$ applied to the input of integrator 20. The points carrying the reference A correspond to the order given by comparator 50 to amplifier 52 for applying the voltage $\Delta W$ to the positive input of amplifier 30 of the actual integrating circuit, whilst point B corresponds to the carrying out of this order, which takes place after the time $T_r$ produced by the delay cell 54. For example, voltage $V_c$ is given as equal to 250 mV, voltage $\Delta W$ as equal to 50 mV and time $T_r$ as equal to 2 ms.

Figure 6B:
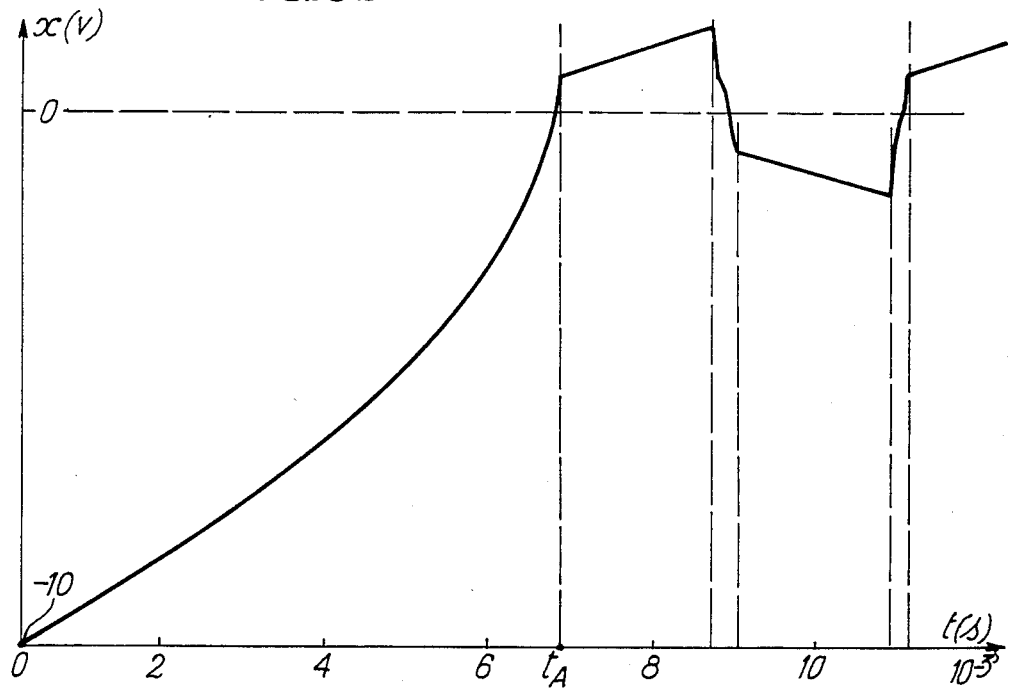

In FIG. 6b and in correlation with FIG. 6a, is shown variations of x, expressed in volts, as a function of time, expressed in seconds. The line corresponding to $x=0$ represents the value of the abscissa $x_M$ of the extremum of curve $y=f(x)$.

According to the invention, the device can be equipped, in the manner shown in FIG. 4, with a system 56 for initializing the voltage applied to the output x of system 16. This initialization can be simply obtained by short-circuiting capacitor $C_3$ of the actual integrating circuit of integrator 20, which supplies the control voltage x. The initial value of x, i.e. $x_0$, is then regulated by a potentiometer 58. In general, $x_0$ is equal to $-10$ V. The resetting to the initial value $x_0$ can be performed either manually, or controlled by a signal applied by a terminal 60 and which can be amplified with the aid of an operational amplifier 62.

The initialization system 56 can also be provided with a blocking device 64, for restoring the control value x to the initial value $x_0$, when curve $y=f(x)$ temporarily has no extreme value in the range of x's varying between $-10$ V and $+10$ V or when the slope of curve $y=f(x)$ is much too small, i.e. less than $10^{-2}$. In both cases, the device according to the invention remains blocked at the value of $x=+10$ V.

Blocking device 64 comprises a comparator 66 for comparing the control voltage x with 10 V and controlling an operational amplifier 68 supplying at the same time as the displacement voltage $\Delta W$ of integrator 20, a high negative voltage in order to restore the value of x to the initial value of −10 V. Blocking device 64 also comprises a delay network 70 making it possible to apply the high negative voltage at the end of a time $t_b$. For example, said time $t_b$ is taken as equal to 10 s.

In order to further define the value of the abscissa $x_M$ of the extremum of curve $y=f(x)$, the device according to the invention can also be equipped with a sampler 72. One of the inputs of sampler 72 is connected to the output of delay cell 54 of system 48 controlling the displacement or shift voltage of integrator 20, whilst the other input of the sampler is connected to input x of system 16.

Sampler 72 comprises an operational amplifier 74, whereof one of the inputs is connected to one of the inputs of another operational amplifier 76 and whose output is connected to the output of the second operational amplifier 76 via two resistors 78 and 80. The output signal of the two operational amplifiers 74 and 76 (common bridge of the resistors) is supplied to an adder having an operational amplifier 82 and a resistor 84, connected between the input and the output of the operational amplifier 82. This adder makes it possible to calculate the half-sum of the output voltages of the two operational amplifiers 74, 76. The further defined value of abscissa $x_M$ of the extremum of curve $y=f(x)$, as well as its evolution over a period of time are obtained at the output S of sampler 72, i.e. at the output of the device of the invention.

The device according to the invention has been tested for different types of curves $y=f(x)$ and in particular with very pointed or very broad curve shapes. The value of the extremum of these various curves has been obtained with a relative accuracy of better than 0.01% of the range −10 V to +10 V, when the extremum does not vary and 0.2% of this range, when the extremum varies with a speed at x of 200 V/s over a period of approximately 1 ms. This device follows the value of the coordinates of the extremum, when said extremum varies both on the ordinate and on the abscissa, with a speed at x of 180 V/s and at y of 60 V/s and at a speed at x of 300 V/s, when the extremum only varies in the range of x's.

It should be noted the values of the different parameters given hereinbefore are only of an exemplified nature and the performance of the device according to the invention is a function of the chosen parameters.

In addition, the device according to the invention has been tested with curves having secondary extreme values (FIG. 1). In this case, the time for determining the value of the main extremum is much shorter than that necessary with the prior art devices.

What is claimed is:

1. A device for determining and following at least one of the instanteous coordinates of the extreme value of a curve $y=f(x)$ characteristic of a system having an input axis and an output y, wherein the device comprises:
   a first differentiator able to produce a first voltage and whose input is connected to the input x of the system;
   a second differentiator able to produce a second voltage, $V_e$, and whose input is connected to the output y of the system;
   a multiplier receiving the first and second voltages produced by the two differentiators for supplying a voltage which represents the multiplication of the first and second voltages produced by said differentiators; and
   an integrator, whose input is connected to the output of said multiplier and whose output is connected to the input x of the system, said integrator supplying at the output the instaneous coordinates of the extreme value.

2. A device according to claim 1, wherein it also comprises a discontinuous gain amplifier, whose input is connected to the output of the second differentiator and whose output is connected to the input of the multiplier, said amplifier being able to produce a voltage $V_s$ which, when the second voltage $V_e$ produced by the second differentiator is negative, is equal to $V_e$ and which, when voltage $V_e$ is positive is equal to $-V_e+C$, C being a constant which is a function of the characteristic parameters of the first differentiator, the integrator and the multiplier.

3. A device according to claims 1 or 2, wherein the integrator has a shift voltage, the device further comprises means for modifying said shift voltage of the integrator and whose input is connected to the output of the second differentiator, said modification consisting of periodically applying to the input of the integrator a voltage $+\Delta W$ and a voltage $-\Delta W$.

4. A device according to claim 3, wherein the means for modifying the shift voltage comprise means for comparing the voltage $V_e$, produced by the second differentiator, with a voltage $V_c$, which is a function of the characteristic parameters of the first differentiator, the integrator and the multiplier and means for periodically applying, after a time $T_r$, the voltage $+\Delta W$ and the voltage $-\Delta W$, when $V_e$ is at the most equal to $V_c$.

5. A device according to claim 1, wherein it also comprises means for initializing the voltage applied to the input x of the system.

6. A device according to claim 5, wherein the initialization means comprises means for regulating the initial voltage and means for restoring the voltage applied to the input x of the system to said initial voltage.

* * * * *